(12) United States Patent
Bisanti et al.

(10) Patent No.: US 10,200,049 B2
(45) Date of Patent: Feb. 5, 2019

(54) MULTI-LOOP PLL STRUCTURE FOR GENERATING AN ACCURATE AND STABLE FREQUENCY OVER A WIDE RANGE OF FREQUENCIES

(71) Applicant: SDRF EURL, Biot (FR)

(72) Inventors: Biagio Bisanti, Antibes (FR); Eric Duvivier, Vallauris Golfe Juan (FR); Lorenzo Carpineto, Antibes (FR); Stefano Cipriani, Antibes (FR); Francesco Coppola, Grasse (FR); Gianni Puccio, La Gaude (FR); Rémi Artinian, Antibes (FR); Francois Marot, Antibes (FR); Vanessa Bedero, Vence (FR); Lysiane Koechlin, Vallauris (FR)

(73) Assignee: SDRF EURl, Sophia Antipolis, Biot (FR)

( * ) Notice: Subject to any disclaimer, the term of this patent is extended or adjusted under 35 U.S.C. 154(b) by 3 days.

(21) Appl. No.: 15/399,040

(22) Filed: Jan. 5, 2017

(65) Prior Publication Data
US 2017/0201262 A1 Jul. 13, 2017

(30) Foreign Application Priority Data
Jan. 7, 2016 (EP) .................................... 16290004

(51) Int. Cl.
*H03L 7/07* (2006.01)
*H03L 7/23* (2006.01)
(Continued)

(52) U.S. Cl.
CPC ................ *H03L 7/23* (2013.01); *H03L 7/093* (2013.01); *H03L 7/099* (2013.01); *H03L 7/185* (2013.01)

(58) Field of Classification Search
None
See application file for complete search history.

(56) References Cited

U.S. PATENT DOCUMENTS 5,128,633 A     7/1992 Martin et al.
5,535,432 A *   7/1996 Dent ..................... H03L 7/1974
                                                            455/12.1
(Continued)

FOREIGN PATENT DOCUMENTS

WO          9900902 A1     1/1999

OTHER PUBLICATIONS

European Search Report of Corresponding EP Application No. EP16290004.7.

*Primary Examiner* — Cassandra Cox
(74) *Attorney, Agent, or Firm* — Robert W. Morris; Eckert Seamans Cherin & Mellott, LLC

(57) ABSTRACT

A multiloop PLL circuit comprising:
  a first PLL loop comprising a first VCO, a first phase detector having a first input receiving a reference frequency (Fref) and a second input receiving the output of a first programmable divider, which input receives the signal generated by the first VCO and a first loop filter connected between said first phase detector and said first VCO;
  at least one auxiliary PLL loop comprising a second VCO, a second phase detector, a second (R1) and a third (N1) programmable dividers, and a second loop filter
  a main loop for generating a desired output frequency Fout comprising a third VCO, a third phase detector, a fourth (Rn) and a fifth (Nn) programmable divider, a main loop filter and a mixer
  additional possible auxiliary PLL loop each comprising a forth VCO, a forth phase detector, a sixth (Ri) and a seventh (Ni) programmable divider, a third auxiliary loop filter and a mixer (Continued)

whereby the desired output frequency Fout is generated in accordance with the relation:

$$F_{out} = (N1/R1 + \ldots + Nn/Rn) * F_{cro}$$

where N1 and R1 are the dividing values of the first auxiliary loop and Ni and Ri with i=2 ... n−1 being the dividing ratios of any possible further auxiliary loop; and Fcro is the frequency generated by VCO, whereby the multiloop circuit is configured with dividing values which optimizes a cost function F.

13 Claims, 10 Drawing Sheets

(51) Int. Cl.
    *H03L 7/093*     (2006.01)
    *H03L 7/099*     (2006.01)
    *H03L 7/185*     (2006.01)

(56) References Cited

U.S. PATENT DOCUMENTS

| | | | |
|---|---|---|---|
| 5,790,942 A * | 8/1998 | Le Corre | H03C 3/0958 |
| | | | 331/2 |
| 9,112,517 B1 * | 8/2015 | Lye | H03L 7/087 |
| 2002/0116308 A1 | 8/2002 | Dujmenovic | |
| 2003/0119466 A1 | 6/2003 | Goldman | |
| 2004/0012447 A1 * | 1/2004 | Nagaishi | G01S 7/35 |
| | | | 331/2 |
| 2015/0326232 A1 * | 11/2015 | Rahbar | H03L 7/0991 |
| | | | 327/156 |

\* cited by examiner $$Fout = (N1/R1 + N2/R2 + \ldots + Nn/Rn) * Fcro$$

$|K*F_{cro} - Fout| \leq 1MHz$ Condition Weight = 1

$1MHz < |K*F_{cro} - Fout| \leq 2MHz$ Condition Weight = 0.8

$2MHz < |K*F_{cro} - Fout| \leq 5MHz$ Condition Weight = 0.5

$5MHz < |K*F_{cro} - Fout| \leq 10MHz$ Condition Weight = 0.2

$|K*F_{cro} - Fout| > 10MHz$ Condition Weight = 0

Typical acceptance condition example

Fig.10

MULTI-LOOP PLL STRUCTURE FOR GENERATING AN ACCURATE AND STABLE FREQUENCY OVER A WIDE RANGE OF FREQUENCIES

TECHNICAL FIELD

The invention relates to the field of electronic circuits and more particularly to a Multiloop PLL structure which generates an accurate and stable frequency.

BACKGROUND ART

Frequency synthesis is a critical part of electronics circuits and, more particularly radio based electronics that operate over multiple frequencies. In that aspect Phase Locked Loops (PLL) have played quite a prominent role in the development of radio, wireless and telecommunications circuits.

FIG. 1 recalls the general principle of a classical PLL structure which can be used in frequency synthesis. A reference oscillator 1 provides a reference signal carrying a frequency $f_{ref}$ which is divided by $N_1$ by means of a divider 2 and then presented at a phase detector 3 which also receives the output of a second divider 6 performing a division by a factor $N_2$. The output of phase detector 3 is presented at the input of a loop filter, e.g. a low pass filter, before entering into a Voltage Controlled Oscillator 5 generating the output signal $f_{out}$ which is also forwarded to the input of divider circuit 6. Such basic arrangement can be used for generating an output frequency $f_{out}=f_{ref} \times (N_2/N_1)$.

Thanks to such PLL circuit, one may produce high frequency oscillations in a large number of electronics circuits and components and particularly radio transmitters and receivers.

Despite the efficiency of the PLL technique, there is still a difficulty in designing RF synthesizer simultaneously providing stability, low phase noise, accuracy and wide range of tuning, which may extend over more than an octave.

Indeed, the more accurate VCO and reference oscillators generally operate in a limited range of frequency and, furthermore, show to be quite expensive, thus increasing the manufacturing costs of the final product.

Consequently, there is still a need to provide an PLL circuit architecture which operates in a wide range of frequencies—over one octave—and which achieves at the same time stability, accuracy as well as low phase noise.

SUMMARY OF THE INVENTION

It is an object of the present invention to carry out a multiloop PLL architecture which achieves stability, accuracy and low phase noise and which further can be used for generating a high frequency extending over a wide range of frequencies.

It is a further object of the present invention to provide a multiloop PLL structure which can be integrated in an Integrated circuit, and which only requires an external oscillator providing stable reference frequency.

It is still another object of the present invention to provide a multiloop PLL structure which is capable of generating a wide range of frequencies, while avoiding spurs interference resulting from the internal loops composing the multiloop PLL.

It is still another objection to provide a multiloop PLL circuit which can generate an accurate, stable and low phase noise output frequency over a wide range of frequencies, while only required a high quality but low cost VCO due to not required trimming and reduced tolerance in their nominal value.

These and other objects of the invention are achieved by means of a multiloop PLL circuit comprising:
- a first PLL loop comprising a first VCO, a first phase detector having a first input receiving a reference frequency (Fref) and a second input receiving the output of a first programmable divider, which input receives the signal generated by the first VCO and a first loop filter connected between said first phase detector and said first VCO;
- at least one auxiliary PLL loop comprising a second VCO, a second phase detector, a second (R1) and a third (N1) programmable dividers, and a second loop filter
- a main loop for generating a desired output frequency Fout comprising a third VCO, a third phase detector, a fourth (Rn) and a fifth (Nn) programmable divider, a main loop filter and a mixer Thanks to such multiloop PLL arrangement, the desired output frequency Fout is generated in accordance with the relation:

$$F_{out} = (N1/R1 + \ldots + Nn/Rn) * F_{cro}$$

Where
N1 and R1 are the dividing values of the first auxiliary loop and Ni and Ri with i=2 . . . n−1 being the dividing ratios of any possible further auxiliary loop;
Nn and Rn are the dividing ratios of the main loop;
Fcro is the frequency generated by VCO.

In one embodiment the multiloop circuit further includes (n−2) auxiliary pll loops, each comprising a VCO, a phase detector, a programmable reference frequency divider (Ri), a programmable feedback frequency divider (Ni), a loop filter and a mixer.

In one embodiment, the programmable dividers are configured with values which allow the generation of the output frequency, but which also optimizes a cost function F.

In one embodiment, the cost function is based on a metrics which is representative of the impact of the spurs generated by the different PLL loops within said Multiloop PLL circuit.

Preferably, the first control voltage oscillator (200, 300, 400) is a coaxial resonator oscillator having a low phase noise even if a low frequency range.

In one embodiment, the first programmable divider is a fractional divider based on a sigma-delta conversion (203, 303, 403).

Preferably, the reference frequency dividers (214, 224, 314, 324, 334, 414, 424, . . . 494) are integer dividers. Preferably at least one of the feedback frequency dividers (213 or 223, 313 or 323 or 333, 413 or 423 . . . or 493) is fractional divider while the remaining could be integers.

The invention also achieves a process for configuring the programmable dividers of the multiloop PLL, which comprises the steps:
- determining the values of, Fcro_min and Fcro_max corresponding with the locking of the first voltage controlled oscillator (200, 300, 400);
- Once the wanted Fout value is known, initiating a loop for the purpose of testing all possible combinations of values (R1, N1, R2, N2, . . . . Nn and Rn) which may possibly be used by the programmable dividers, and
- for each combination, computing a metrics based on a function stored within a memory depending on the values of Fcro, as well as the division values (R1, N1, R2, N2, .... Nn and Rn); and storing into a memory the value of each metrics together with the current combination of dividers values (R1, N1, R2, N2, .... Nn and Rn);

testing whether all combinations have been processed and, if so, retrieving the value of the lowest metrics;

configuring said programmable dividers with the associated combination of parameters (R1, N1, R2, N2, .... Nn and Rn) being stored into the memory and which corresponds to the lowest metrics.

DESCRIPTION OF THE DRAWINGS

Other features of one or more embodiments of the invention will appear from the following description of embodiments of the invention, with reference being made to the accompanying drawings.

FIGS. 9 and 10 are illustrative views of acceptance conditions which may also be used for selecting a set of configuration parameters.

DESCRIPTION OF THE PREFERRED EMBODIMENT

With respect to the FIGS. 2-6, there will now be described how one can achieve the realization of a multiloop PLL arrangement that allows the tuning of an accurate, stable frequency with low phase and which provides a wide tuning range.

As known by a skilled man, the reduction of phase noise generally requires the use of oscillation circuits with great quality factors. Unfortunately, such circuits can only operate within a limited range of frequencies.

The embodiments which are described below generate a frequency over a wide range, more than one octave, while maintaining at a very low level the phase noise. This is achieved by means of a multiloop architecture which offer redundancy in the choice of the internal frequencies operating in the individual loops, and also thanks to a process for properly selecting the internal frequencies. The operating of the multiloop architecture can thus be optimized and, particularly, undesired spurs can be effectively eliminated or, at least, significantly reduced.

Figure 1:
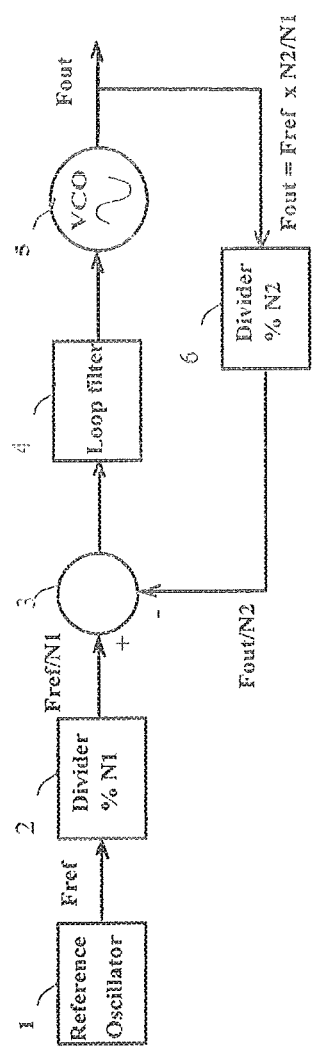
FIG. 1 illustrates the general principle of a basic PLL structure used in frequency synthesis.
Figure 2:
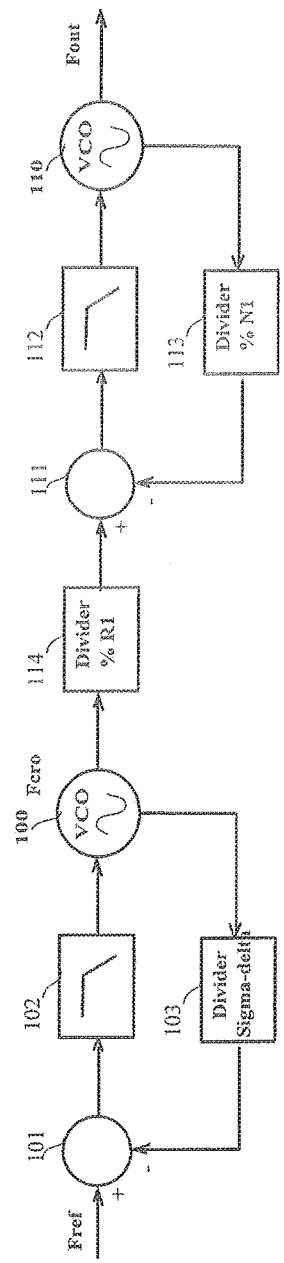
FIG. 2 illustrates a first embodiment which is based on dual loop PLL architecture.

FIG. 2 illustrates one first embodiment of a dual loop PLL architecture which can use the configuration process which shall be described hereinafter.

The circuit comprises a first loop based on a first voltage controlled oscillator (VCO) 110 associated with a phase detector 111, a loop filter 112 and two dividers 113 and 114 having dividing ratios respectively equal to N1 and R1.

Divider 114 has an input and an output, the latter being connected to a first (non-inverting) input of phase detector 111 having a second inverting input receiving the output of divider block 113, the input of which is connected to receive the output frequency $F_{out}$ of VCO 110. Phase detector 111 has an output which is connected to an input of a low pass filter 112, which output is further connected to the input of VCO 110, generating the output frequency $F_{out}$. Dividers 113 and 114 are configured to apply dividing ratios of N1 and R1, respectively.

The circuit of FIG. 2 further comprises a second loop based on a second voltage controlled oscillator (VCO) 100 associated with a phase detector 101 having a first input (positive) receiving a reference frequency $F_{ref}$ and a second input (inverting) receiving the output of a fractional sigma-delta divider 103. The output of phase detector 101 is connected to an input of a loop filter 102, such as a low pass filter, which output is further connected to the input of VCO 100. The output of VCO 100 generates a signal having a frequency Fcro and is also connected to an input of fractional sigma-delta divider 103 and to a divider block 114 having a dividing ratio equal to a first parameter R1.

The first embodiment can be used for generating an output voltage having a frequency $F_{out}$ such as:

$$F_{out}=(N1/R1)*F_{cro}$$

Where

N1 and R1 are the dividing ratios of blocks 113 and 114, respectively, and

Fcro is the frequency generated by VCO 100.

One sees that a first level of redundancy in the values of the programmable dividers is allowed with this first embodiment since different values for divider blocks 113, 114 and Fcro lead to the same output frequency. For example (N1_1/R1)*Fcro_1=(N1_2/R1)*Fcro_2 for divider blocks 113 and 114 lead to the same ratio N1/R1 and, thus, the same output frequency. In particular, one may multiply each value by two in each one of the two blocks 113 and 114 while keeping unchanged the ratio N1/R1 and, thus, outputting a same output frequency $F_{out}$.

As will be shown hereinafter with details, the inventors have taken advantage of such redundancy for the purpose of optimizing the operating of the PLL architecture in accordance with one predetermined criterion, and the level of redundancy can be even more increased with the embodiments which will now be described.

Figure 3:
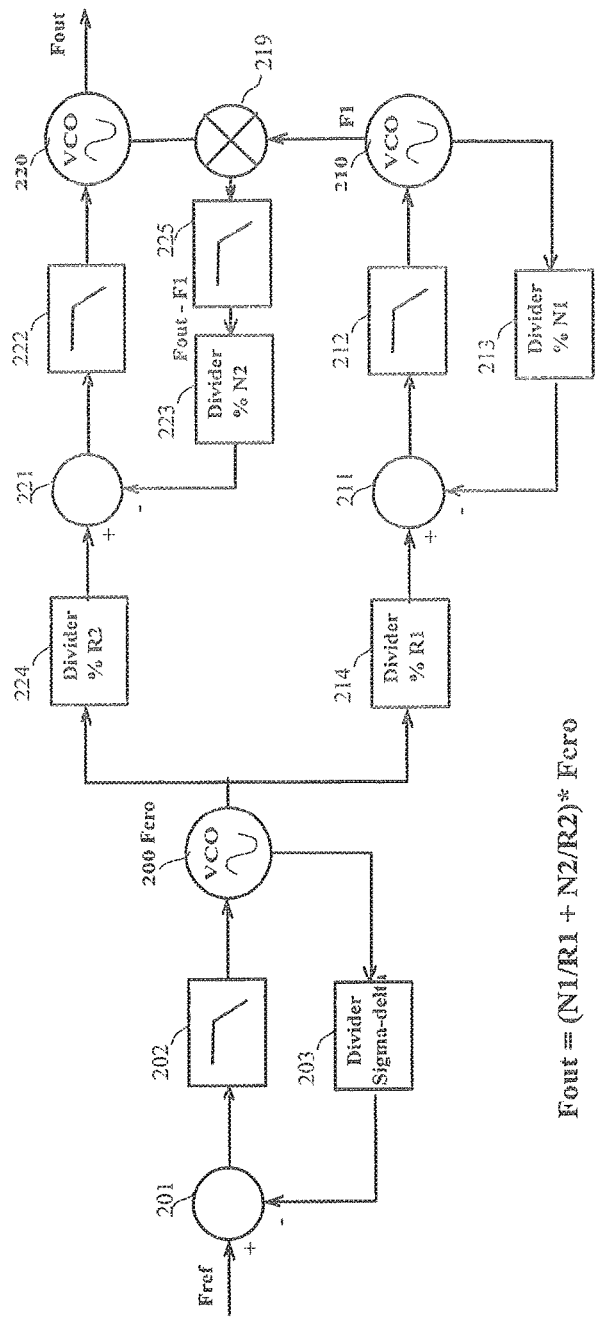
FIG. 3 illustrates a second embodiment which is based on three loops PLL architecture.

Indeed, with respect to FIG. 3, a second embodiment is now described which corresponds to a preferred embodiment for synthesizing an output frequency which can be tuned in a wide range of frequencies, and which is based on the use of three distinctive loops increasing the level of redundancy in the transfer function.

The circuit of FIG. 3 comprises a first loop acting as an auxiliary loop, based on a first voltage controlled oscillator (VCO) 210 for generating an auxiliary intermediate frequency F1, and associated with a phase detector 211, a loop filter 212 and two dividers 213 and 214, having dividing values being respectively equal to N1 and R1. The general arrangement of blocks 210-214 of FIG. 3 is similar to that of blocks 110-114 of the first embodiment illustrated in FIG. 2. More particularly, divider 214 has an input and an output, the latter being connected to a first (non-inverting) input of phase detector 211 having a second inverting input receiving the output of divider block 213, the input of which is connected to receive a first intermediate frequency F1 generated by VCO 210. Phase detector 211 has an output which is connected to an input of a low pass filter 212, which output is further connected to the input of VCO 210, generating a first intermediate frequency F1, which is fedback to an input of divider 213 as well as to a first input of a mixer 219 represented in the FIG. 3.

The circuit of FIG. 3 further comprises a comprises a second loop acting as a main loop generating the desired output frequency based on a second voltage controlled oscillator (VCO) 220 associated with a phase detector 221, a loop filter 222, a filter 225 and two dividers 223 and 224, having dividing values being equal to N2 and R2, respectively. Divider 224 has an input receiving the frequency $F_{cro}$ and has an output which is connected to a first (non-inverting) input of phase detector 221 having a second inverting input receiving the output of divider block 223, the input of which is connected to receive the output of filter 225 receiving the output of mixer 219. Phase detector 221 has an output which is connected to an input of loop filter 222 (e.g. a low pass filter), which output is further connected to the input of VCO 220 generating the output frequency, which is feedback to a second input of mixer 219.

The circuit of FIG. 3 further comprises a third loop based on a second voltage controlled oscillator (VCO) 200 associated with a phase detector 201 having a first input (positive) receiving a reference frequency $F_{ref}$ and a second input (inverting) receiving the output of a fractional sigma-delta divider 203. The output of phase detector 201 is connected to an input of a low pass filter 202 which generates a voltage at its output which is used for controlling VCO 200. The output of VCO 200 is also connected to an input of fractional sigma-delta divider 203 and to the input of divider 224 of the second loop.

One sees that, thanks to the arrangement of those three loops, mixer 219 produces the sum and difference of two signals generated by VCO 220 and 210, respectively, and only the difference Fout–F1 is being entered into divider block 223 used in the feedback path of the second loop.

Consequently, the second embodiment which was described above can be used for generating an output voltage having a frequency $F_{out}$ such as:

$$F_{out}=(N1/R1+N2/R2)*F_{cro}$$

Where

N1 and R1 are the dividing ratios of blocks 213 and 214, respectively, and

N2 and R2 are the dividing ratios of blocks 223 and 224, respectively, and Fcro is the frequency generated by VCO 200.

One sees that the PLL architecture described in FIG. 3 significantly increases the level of redundancy of the frequency synthesis. Such level of redundancy is advantageously used for optimizing the frequency synthesis while taking into account a number of constraints: range of frequency for each VCO, accuracy of VCO oscillator 300 generating the frequency $f_{cro}$.

In the preferred embodiment of FIG. 3, the following configuration is made to the different elements:

VCO 200 is a coaxial resonator oscillator which is an integrated oscillator associated with an appropriate LC resonator, which may be external, when required. Such component shows quite a high stability and low phase notice but is however subject to a large dispersion resulting from the manufacturing process. Consequently, VCO 200 is a very low noise oscillator with very small frequency range but with strong frequency variation from sample to sample. This oscillator is locked by a Sigma Delta PLL operating in the third loop of the second embodiment allowing to continuously lock it within its range.

VCO 210 is an intermediate frequency oscillator which is locked with a very low noise floor fractional PLL to the VCO 200 (cro). The frequency range of the VCO 210 is known.

Divider 203 is a very accurate fractional divider based on sigma-delta conversion providing very fine resolution so as to accurately set the value of frequency Fcro of the VCO 200.

Divider 213 is an analog fractional divider and dividers 214, 223 and 224 are programmable dividers, with division values R1, N2 and R2 being integers.

Phase detectors 201, 211 and 221 are phase detectors which, in the preferred embodiment, also include a charge pump for the purpose of supplying sufficient current to the analog R/C network composing the low pass filter of the subsequent blocks 202, 212 and 222, respectively.

According to the equation:

$$F_{out}=(N1/R1+N2/R2)*F_{cro}$$

The third PLL loop takes care to lock the VCO 200 (cro) between its limits $F_{cro\_min}$ and $F_{cro\_max}$ with very small frequency step, and this provides the required small frequency steps for the output frequency. Once the VCO 200 (cro) has completed its range, the division ratio of fractional divider 213 is increased and the VCO 200 (cro) is again lock to a smaller frequency value.

In this way, the small fractional ratio provided by divider 213 of the first PLL fixes the limit for the frequency range of VCO 200. The coefficient R2 and N2 are used to increase by big step the output frequency range compared to the VCO 210 frequency range. In fact the output VCO can cover a huge frequency range, which can extend over an octave.

One eventually sees that by using a VCO 200 (cro) providing stable frequency with low phase noise, one may, by properly setting the dividers ratio, accurately adjust the value of the output frequency $F_{out}$ so as to match any predetermined requirements, even if the nominal value of $F_{cro}$ is subject to quite a large dispersion due to the manufacturing process.

Consequently, the second embodiment is particularly suitable for synthesizing a frequency within the range of 6.8 Ghz and 13.6 Ghz. Those figures should only be considered as illustrative non limiting examples only.

Furthermore, one will see hereinafter in detail, that the level of redundancy which is provided by the second embodiment can be advantageously used in a configuration process setting the different parameters of all dividers blocks.

Figure 4:
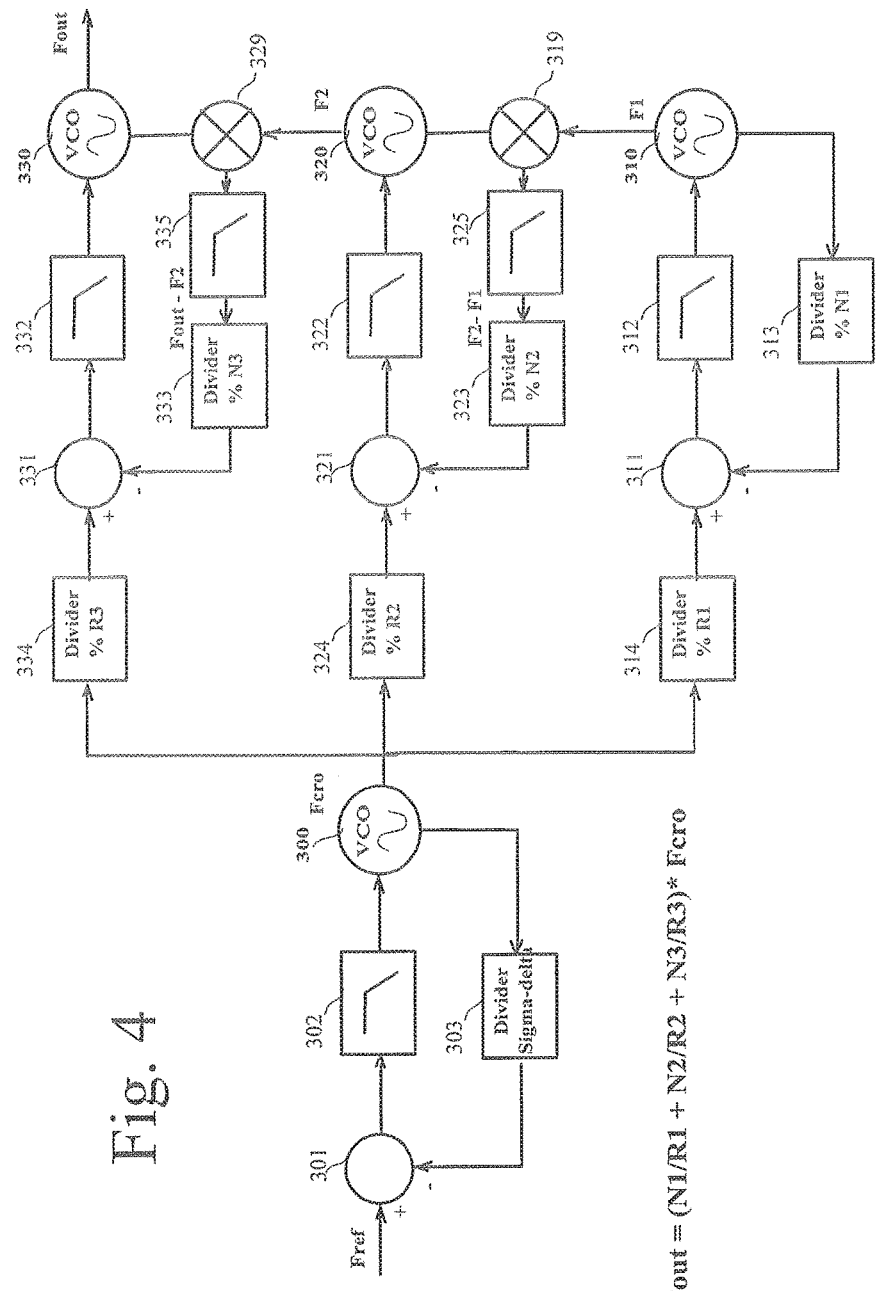
FIG. 4 illustrates a third embodiment which is based on a four loop PLL architecture.

FIG. 4 shows a third embodiment which still increases the level of redundancy of the PLL multiloop architecture which is based on the use of four distinctive loops increasing the level of redundancy in the transfer function.

The circuit of FIG. 4 comprises a first loop acting as a first auxiliary loop, based on a first voltage controlled oscillator (VCO) 310 associated with a phase detector 311, a loop filter 312 and two dividers 313 and 314, having dividing values being respectively equal to N1 and R1. Blocks 310-314 of FIG. 4 are similar to blocks 210-214 of FIG. 2. More particularly, divider 314 has an input and an output. The output of divider 314 is connected to a first (non-inverting) input of phase detector 311 having a second inverting input receiving the output of divider block 313, the input of which is connected to receive a first intermediate frequency F1 generated by VCO 310. Phase detector 311 has an output which is connected to an input of a low pass filter 312, which output is further connected to the input of VCO 310, generating the first intermediate frequency F1, which is fedback to an input of divider 313 as well as to a first input of a mixer 319 represented in the FIG. 4.

The circuit of FIG. 4 further comprises a second loop acting as a second auxiliary loop, based on a second voltage controlled oscillator (VCO) 320 associated with a phase detector 321, a loop filter 322, a filter 325 and two dividers 323 and 324, having dividing values being equal to N2 and R2, respectively. Blocks 319-325 are similar to blocks 219-225, respectively. Divider 324 has an input receiving the frequency $F_{cro}$ and has an output which is connected to a first (non-inverting) input of phase detector 321 having a second inverting input receiving the output of divider block 323, the input of which is connected to receive the output of filter 325 receiving the output of mixer 219. Phase detector 321 has an output which is connected to an input of low pass filter 322, which output is further connected to the input of VCO 320 generating a second intermediate frequency F2, which is fedback to a second input of mixer 319.

The circuit of FIG. 4 further comprises a comprises a third loop acting as a main loop generating the desired output frequency $F_{out}$, based on a third voltage controlled oscillator (VCO) 330 associated with a phase detector 331, a loop filter 332, a low pass filter 335 and two dividers 333 and 334, having dividing values being equal to N3 and R3, respectively. The arrangement of blocks 330-335 is quite similar in construction to that of blocks 320-325, respectively. Divider 334 has an input receiving the frequency $F_{cro}$ and has an output which is connected to a first (non-inverting) input of phase detector 331 having a second inverting input receiving the output of divider block 333, the input of which is connected to receive the output of filter 335 receiving the output of a mixer 229. Phase detector 331 has an output which is connected to an input of low pass filter 222, which output is further connected to the input of VCO 330 generating the output frequency $f_{out}$, which is fedback to a second input of mixer 229.

The circuit of FIG. 4 further comprises a fourth loop based on a fourth voltage controlled oscillator (VCO) 300 associated with a phase detector 301 having a first input (positive) receiving a reference frequency $F_{ref}$ and a second input (inverting) receiving the output of a fractional sigma-delta divider 303. The output of phase detector 301 is connected to an input of a low pass filter 302 which generates a voltage at its output which is used for controlling VCO 300. The output of VCO 300 is also connected to an input of fractional sigma-delta divider 303 and to the input of dividers 314, 324 and 334 of the first, second and third loops, respectively.

One sees that, thanks to the arrangement of those four loops, mixer 319 (resp. 329) produces the sum and difference of two signals generated by VCO 310 and 320 (resp. 330, 320) and only the difference F2−F1 (resp. $F_{out}$−F2 is being entered into divider block 323 (resp. 333) used in the feedback path of the second (resp. third) loop.

Consequently, the second embodiment which was described above can be used for generating an output voltage having a frequency $F_{out}$ such as:

$$F_{out}=(N1/R1+N2/R2+N3/R3)*F_{cro}$$

Where
N1 and R1 are the dividing ratios of blocks 313 and 314, respectively, and
N2 and R2 are the dividing ratios of blocks 323 and 324, respectively,
N3 and R4 are the dividing ratios of blocks 333 and 234, respectively, and Fcro is the frequency generated by VCO 300.

The third embodiment still increases the level of redundancy in the selection of the dividers parameters.

Figure 5:
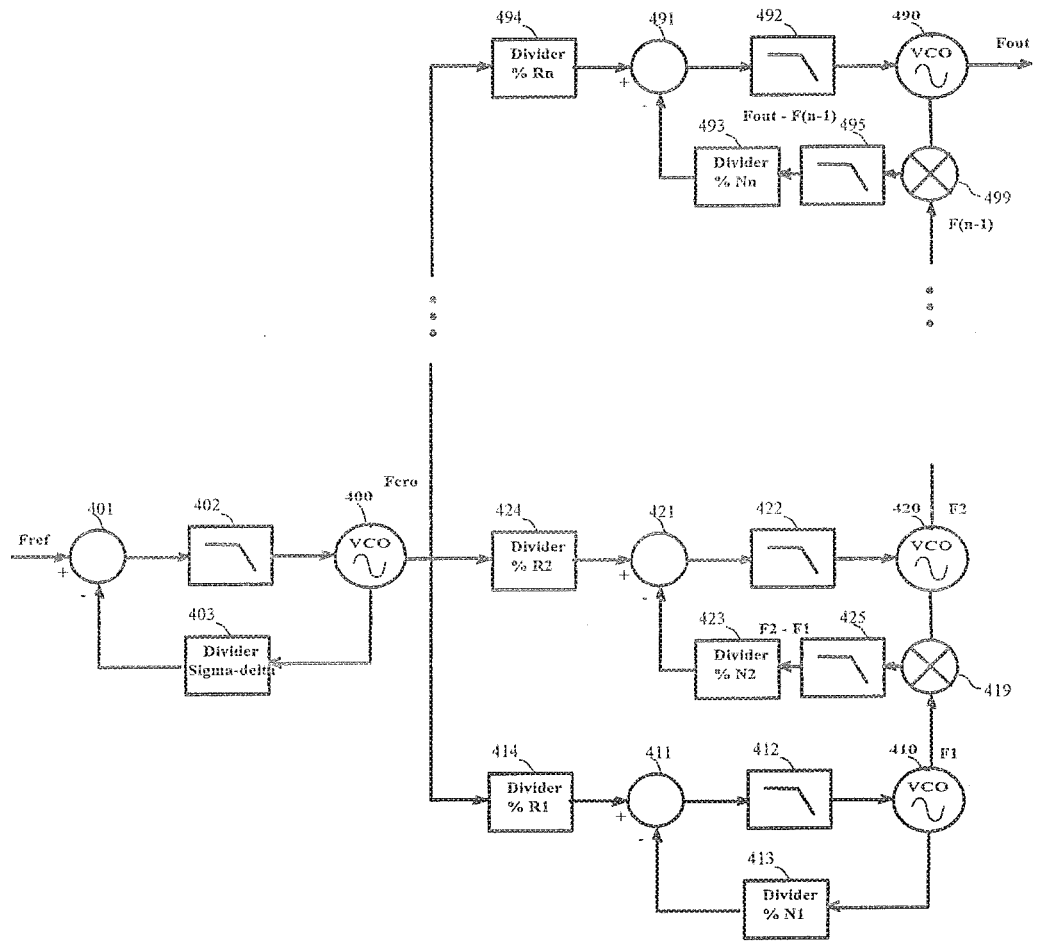
FIG. 5 illustrates a fourth embodiment which is based on n loop PLL architecture.

And there is no limitation in the level of redundancy which may be used, since FIG. 5 illustrates a fourth embodiment of a multiloop PLL architecture based on n+1 loops.

The circuit of FIG. 5 comprises a first loop acting as a first auxiliary loop, based on a first voltage controlled oscillator (VCO) 410 associated with a phase detector 411, a loop filter 412 and two dividers 413 and 414, having integer dividing values being respectively equal to N1 and R1. As previously, blocks 410-414 of FIG. 5 are similar to blocks 310-314 of FIG. 4. More particularly, divider 414 has an input and an output. The output of divider 414 is connected to a first (non-inverting) input of phase detector 411 having a second inverting input receiving the output of divider block 413, the input of which is connected to receive a first intermediate frequency F1 generated by VCO 410. Phase detector 411 has an output which is connected to an input of a low pass filter 412, which output is further connected to the input of VCO 410, generating the first intermediate frequency F1, which is fedback to an input of divider 413 as well as to a first input of a mixer 419 represented shown in FIG. 5.

The circuit of FIG. 5 further comprises a comprises a second loop acting as a second auxiliary loop, based on a second voltage controlled oscillator (VCO) 420 associated with a phase detector 421, a loop filter 422, a filter 425 and two dividers 423 and 424, having dividing values being equal to integers N2 and R2, respectively. Blocks 419-425 are similar to blocks 319-325, respectively in FIG. 4. Divider 424 has an input receiving the frequency $F_{cro}$ and has an output which is connected to a first (non-inverting) input of phase detector 421 having a second inverting input receiving the output of divider block 423, the input of which is connected to receive the output of filter 425 receiving the output of mixer 419. Phase detector 421 has an output which is connected to an input of low pass filter 422, which output is further connected to the input of VCO 420 generating a second intermediate frequency F2, which is fedback to a second input of mixer 419.

The circuit of FIG. 5 can includes as many auxiliary PLL loops as necessary, and the figure illustrates a realization showing a set of n−1 auxiliary loops.

The nth loop which is represented acts as a main loop for the purpose of generating the desired output frequency Fout, based on the nth voltage controlled oscillator (VCO) 490 associated with a phase detector 491, a loop filter 492, a low pass filter 495 and two dividers 493 and 494, having dividing values being equal to Nn and Rn, respectively. The arrangement of blocks 490-495 3 is quite similar in construction to that of blocks 420-425, respectively. Divider 494 has an input receiving the frequency $F_{cro}$ and has an output which is connected to a first (non-inverting) input of phase detector 491 having a second inverting input receiving the output of divider block 493, the input of which is connected to receive the output of filter 495 receiving the output of a mixer 499. Phase detector 491 has an output which is connected to an input of low pass filter 492, which output is further connected to the input of VCO 490 generating the output frequency $f_{out}$, which is fedback to a second input of mixer 499.

At last, the circuit of FIG. 5 further comprises a n+1th loop based on a fourth voltage controlled oscillator (VCO) 400 associated with a phase detector 401 having a first input (positive) receiving a reference frequency $F_{ref}$ and a second input (inverting) receiving the output of a fractional sigma-delta divider 403. The output of phase detector 401 is connected to an input of a low pass filter 402 which generates a voltage at its output which is used for controlling VCO 400. The output of VCO 400 is also connected to an input of fractional sigma-delta divider 403 and to the input of dividers 414, 424, . . . and 493 of the first, second, . . . nth loops, respectively.

One sees that, thanks to the arrangement of those n loops, mixer 419 (resp. 429, . . . 499) produce the sum and difference of two signals generated by the two VCO connected at their respective entries. And only the difference is fed back to the counterpart filter 423 (resp. 433, . . . 493) what leads that only the difference Fout−F(n−1) is being entered into divider block 493 used in the feedback path of the nth loop generating the output frequency $F_{out}$.

Consequently, the fourth embodiment which was described above can be used for generating an output voltage having a frequency $F_{out}$ such as:

$$F_{out}=(N1/R1+N2/R2+ \ldots +Nn/Rn)*F_{cro}$$

Where

N1 and R1 are the dividing ratios of blocks 413 and 414, respectively, and N2 and R2 are the dividing ratios of blocks 423 and 424, respectively, Nn and Rn are the dividing ratios of blocks 493 and 494, respectively, and Fcro is the frequency generated by VCO 400.

The PLL multiloop structures which were described above, respectively in the first, second, third and fourth embodiments, have the common property of providing a certain degree of redundancy in the selection of the different division values (N1, N2, . . . Nn) and (R1, R2, . . . , Rn) for generating an accurate output frequency $F_{out}$.

Indeed, one sees that by changing the value of N1 and R1 simultaneously, e.g. by multiply their value by 2, one may keep the ratio N1/R1 unchanged. Furthermore, one further sees that by simultaneously changing the values of all parameters N1 . . . −Nn . . . R1-Rn, one can keep unchanged the value of the following expression:

$$(N1/R1+N2/R2+ \ldots +Nn/Rn)*Fcro$$

The present invention takes advantage of the level of redundancy provided by the multiloop arrangements described above, for the purpose of providing a large flexibility in the selection of the different frequencies operating within the PLL multiloop architecture. Such flexibility has the advantage that VCO 200 (cro), in the example of the second embodiment of FIG. 3, is only required to provide a limited frequency range, and this range is very small compared to its nominal frequency. Therefore, even if the VCO 200 (cro) has a significant spread—much higher than its frequency range—this can be compensated by precisely adjusting the N2/R2 division parameters. In this way, one may use high quality low cost components, which do not require any trimming or reduced tolerance in their nominal value, for the purpose of embodying, for instance in the preferred embodiment of FIG. 3, the third PLL loop.

Furthermore, and this is quite more advantageous, the above mentioned flexibility opens the way to some significant possibilities of optimization, thanks to an appropriate selection of a set of particulars values for parameters (N1, Nn) and (R1, Rn) which optimizes a predetermined criterion. In one particular example, the selection of parameters is performed for the purpose of reducing the range of a given ratio, e.g. ratio N1/R1, or even the range of frequencies used by one particular loop composing the PLL architecture.

Many other different criteria can be individually considered or even combined.

In one embodiment, the selection of parameters is used for minimizing or maximizing a cost function F, related to one particular criterion. More particularly, a set of metrics is computed for giving a weight to each set of configuration parameters {(N1 . . . Nn) (R1 . . . Rn), Fcro} used for programmable dividers and CRO output frequency (eg dividers 203, 213, 214, 223,224 and VCO 200).

In one embodiment, those metrics are representative of the spurs impact created by the different oscillators in the different loops (eg VCO 200, 210 and 220 in FIG. 3 or VCO 400, 410, 420 . . . 490 in FIG. 5).

This is quite advantageous since the multiloop PLL involves the running of several different oscillators at the same time (eg VCO 400, 410, 420, etc. . . . ). With the consequence that the frequencies of those oscillators, together with their harmonics, will interact (either directly or through non linearity with intermodulation products) generating spurs.

The flexibility of the multiloop which was evoked above, is that several different values of Fcro, N2, N1, R2 and R1 can be used to get the same output frequency $f_{out}$. This means that the different oscillators can be set at different frequencies and their harmonics will move even more creating the spurs in different positions. Once the PLL is fully configured, with the setting of all programmable dividers (integer and fractional), the interactions between the different oscillators frequencies (and their harmonics) can be precisely evaluated and it is possible to create a list of condition to avoid (minimum distance between frequencies or harmonics) in order not to have spurs in a wanted frequency range.

In one embodiment, the metrics which is computed in relation with the spurs impact, take into account a large number of harmonics, including high order harmonics, when the output frequency range is high and wide.

In one embodiment, the PLL architecture uses an initialization procedure which includes a measurement process of the limits of the particular VCO oscillator (cro), e. g. VCO 200 in FIG. 3, generating the $F_{cro}$ frequency.

The process starts with a first step 61, which is the power-on of the circuit. Subsequent to this power-on, the electronic circuit including the PLL architecture may execute a set of internal routines which are well known to a skilled man and which will not be further developed.

Then, in a step 62, the process proceeds with an evaluation of value Fcro_min which is characteristics of the particularly component used for embodying VCO 200 (in the particular circuit of FIG. 3). To achieve this, the process proceeds with a continuous set of variations in the ratio of the sigma-delta divider 203, together with a sensing of the voltage present at the output of filter 202. When the voltage is detected to be higher than one first predetermined threshold, then the VCO 200 (cro) is assumed to be fully operational, and the corresponding value of divider 203 is being stored as corresponding to Fcro_min. By way of illustration, in one non limiting example of embodiment, the first predetermined threshold is set to be equal to 0.2 volts, and the division value of divider 203 is stored as soon as the voltage goes higher 0.2 volt.

Then, in a step 63, the process proceeds with an evaluation of value Fcro_max which is characteristics of the particularly component used for embodying VCO 200 (in the particular circuit of FIG. 3). To achieve this, the process proceeds again with a continuous set of variations in the ratio of the sigma-delta divider 203 while measuring the voltage present at the output of filter 202. When the voltage is detected to be higher than one second predetermined threshold, for example 3.7 Volts in one illustrative embodiment, the division value of divider 203 is stored within a memory located in the circuit as corresponding to value Fcro_max.

Once the two values of Fcro_min and Fcro_max have been stored, the process then proceeds to a step 64 which is the end of the measuring procedure.

Figure 6:
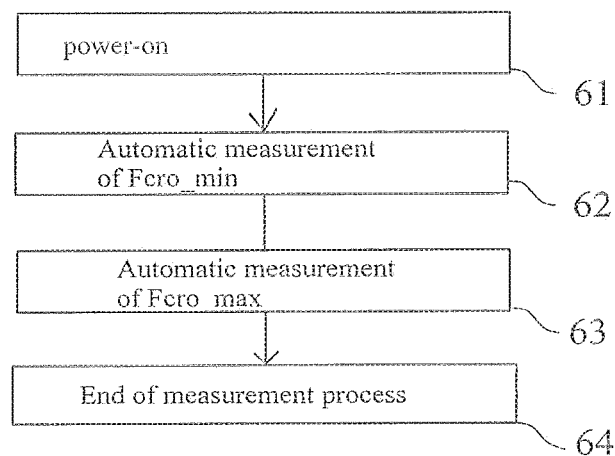
FIG. 6 illustrates a process which is executed at the power-on of the circuit for the purpose of measuring the characteristics of VCO (200, 300, 400).

The process of FIG. 6 is being executed by means of a processor located within the circuit, which can also be used for computing, for any given value of the output frequency $F_{out}$, the limits of the intermediate frequency F1. Furthermore, the processor can also be used for computing several set of values of N1/R1, N2/R2 etc. . . . , that can be used for generating the desired output frequency $F_{out}$.

This computation is performed in the process which will now be described in relation to FIG. 7, which is executed for checking all the possible combinations in relation with one predetermined criterion, particularly for avoiding to have any spur generated in the band of interest. If one particular combination of values R1/N1, R2/N2 succeeds in the checking, then such combination is validated and used for generating the output frequency. On the contrary, if the checking fails for the considered combination, then another combination is being computed and checked.

When a metrics is being used, the process computes the metrics for every combination being computed and stores the corresponding results. When all the possible combinations have been computed and checked, the process retrieves the best value of the metrics (either the lower or the higher value) and validates the corresponding combination so as to generate the output frequency.

With respect to FIG. 7, there will now be described a further process which is used during the initialization procedure which shows how to take advantage of the metrics representative of the spurs impact, so as to properly configure the different programmable dividers located into the multiloop PLL.

The process starts with a step 71.

Then, in a step 72, the process determines the particular values of Fout, Fcro_min and Fcro_max. Fout is generally the output frequency which is wished for the particular application being considered. And Fcro_min and Fcro_max can be evaluated thanks to the process which was described in relation to FIG. 6.

The process then proceeds to a step 73, where the extremes values of (N2/R2)min and (N2/R2)max are computed, which extreme values will be used for identifying all possible combinations of values within range [(N2/R2)min, (N2/R2)max] to be used for settings dividers 223 and 224.

Then, in a step 74, a current value of N2/R2 is set to be equal (N2/R2)min which is the lower value of the range [(N2/R2)min, (N2/R2)max].

The process then proceeds to a step 75, where the extremes values of (N1/R1)min and (N1/R1)max are computed which corresponds to the current value N2/R2, which extreme values will be used for identifying all possible combinations of values within range [(N1/R1)min, (N1/R1) max] to be used for settings dividers 213 and 214.

Then, in a step 76, a current value of N1/R1 is set to be equal (N1/R1)min which is the lower value of the range [(N1/R1)min, (N1/R1)max].

Then the process proceeds to a step 77 where the value of $F_{cro}$ is computed for the purpose of generating the output frequency value $F_{out}$. This value of $F_{cro}$ is considered to be the current value of $F_{cro}$ The process then proceeds to a step 78 where the metrics corresponding to the current values of ($F_{cro}$, N1, R1, N2, R2) is being computed. Generally speaking such metrics shows to be a function of the above mentioned parameters which is stored into a memory for rapidly determining the spur impact—or any other criterion—corresponding to the current values of the parameters.

In step 79 a test is performed for determining whether the metrics is equal to zero which corresponds to a combination of ($F_{cro}$, N1, R1, N2, R2) having no spur impact, in which case the process proceeds to a step 80 which validates such combination for use for generating the output frequency Fout, and then completes in a step 81.

On the contrary, if the metrics computed in step 78 shows a weight being non null, this metrics is stored in a step 82 together with the corresponding combination of values ($F_{cro}$, N1, R1, N2, R2).

Then the process proceeds to a step 83 for checking whether the ratio N1/R1 is inferior than (N1/R1) max.

If the test of step 83 succeeds, this indicates that other possible combinations of N1 and R1 need to be checked and the process then proceeds to a step 84 where the value of the ratio N1/R1 is increased by one step. It should be noticed that the level of increase of ratio N1/R1 depends on the practical realization of programmable divider 213 and 214 and is left to the skilled man. Subsequent to the completion of step 84, the process returns to step 77 for the purpose of computing a new value of Fcro corresponding to the updated ratio N1/R1.

If the test of step 83 fails, this means that all possible combination of N1 and R1 were tested and a new set of combination for values N2 and R2 needs to be checked. The process then proceeds to a step 85 for checking whether the ratio N2/R2 is inferior than N2/R2max.

If the test of step 85 succeeds, this indicates that other possible combinations of N2 and R2 need to be checked and the process then proceeds to a step 86 where the value of the ratio N2/R2 is increased by one step with a new combination of current values N2 and R2. Subsequent to the completion of step 86, the process returns to step 75 for the purpose of recomputing the values of (N1/R1)min and (N1/R1)max corresponding to the updated current value of N2/R2.

If the test of step 85 fails, this means that that all possible combination of N2 and R2 were tested and the process proceeds to a step 87 where the lower value of the metrics is retrieved, together with the corresponding combination of values ($F_{cro}$, N1, R1, N2, R2). Those values are then used for configuring the programmable dividers 213, 214, 223, 224 and 203 and the process ends in a step 88.

Figure 7:
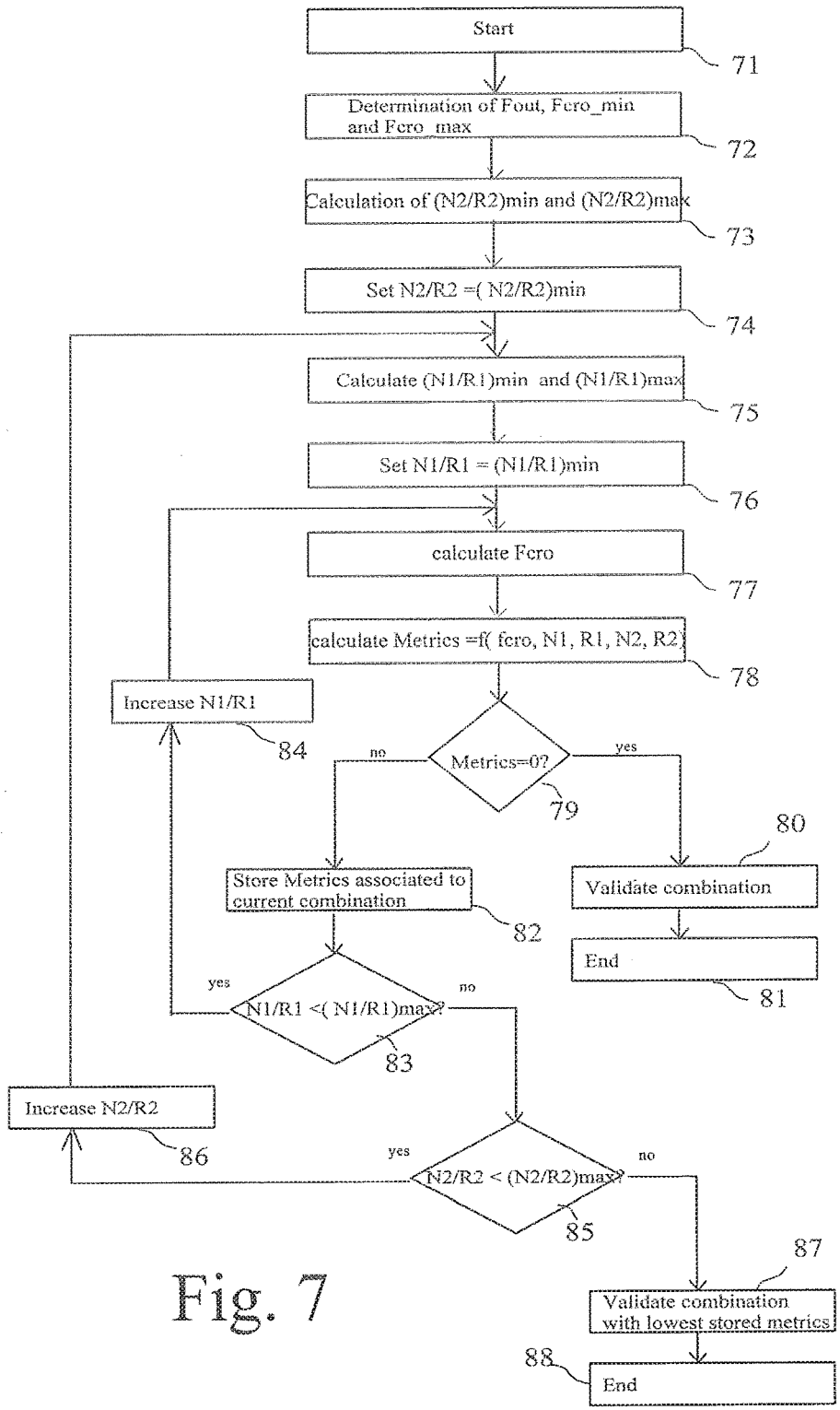
FIG. 7 illustrates a process which is executed for settings the parameters and divider ratios in the third embodiment for the purpose of generating a stable, accurate predetermined output frequency $f_{out}$.

The process of FIG. 7 has been described in relation with the second embodiment of FIG. 3. However, it is clear that such process may be adapted by a skilled man so as to apply to other configurations, and more particularly to the general architecture of FIGS. 4 and 5.

Figure 8:
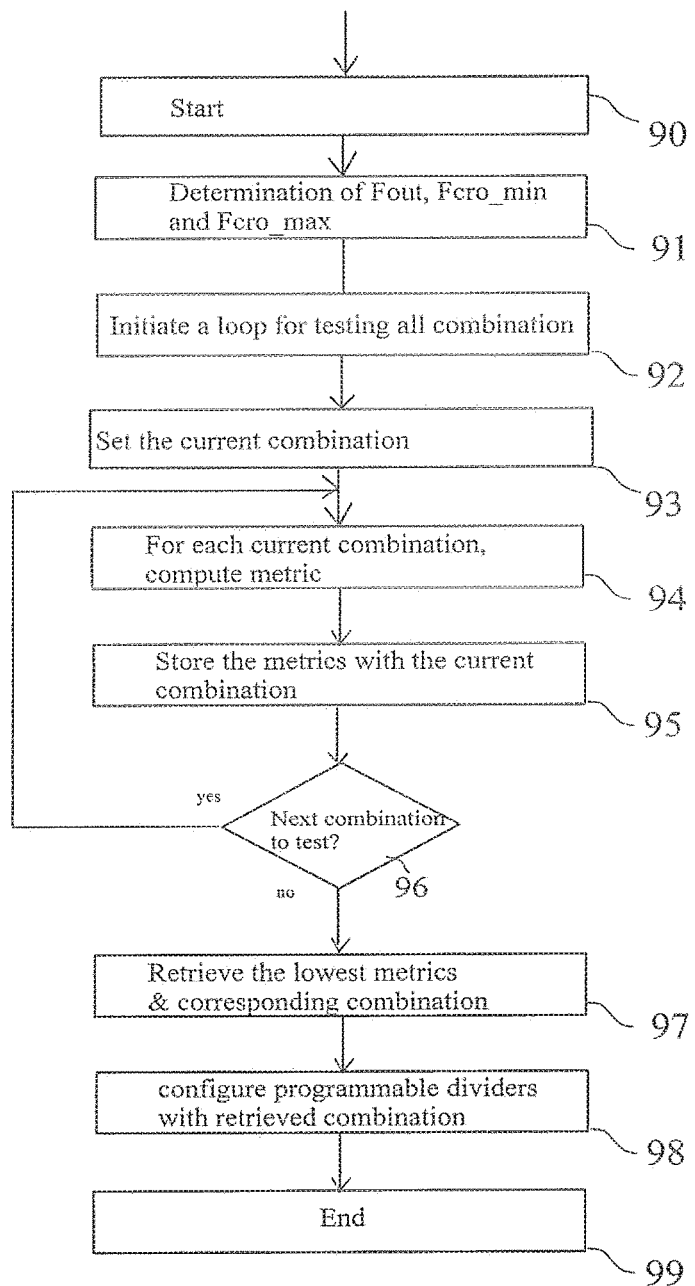
FIG. 8 illustrates the general process which can be used for configuring any multiloop PLL in accordance with the present invention.

Generally speaking, the process executed at the initialization phase will involves the following steps illustrated in FIG. 8.

The process starts with a step 90.

Then the process proceeds in a step 91 with the determination of Fout, Fcro, Fcro_min and Fcro_max as previously in step 72 of FIG. 7.

Then the process proceeds in a step 92 with the initiating of a FOR loop for the purpose of testing all possible combinations of values of Fcro, R1, N1, R2, N2, . . . . Nn and Rn.

Then, in a step 93, the process sets a current combination among all possible combinations of values.

Then, in a step 94, the process computes the metrics corresponding to the current combination in accordance with the function which is stored within the internal memory, and which depends on the values of Fcro, R1, N1, R2, N2, . . . . Nn and Rn.

Then, the process proceeds in a step 95 with the storage into the memory of the metrics computed.

Then, in a step 96, a test is performed in order to determine whether a next combination needs to be tested, in which case the process returns to step 94 for the purpose of computing a metrics corresponding to the next combination.

If the test of step 96 fails, this means that all combinations were tested and the process then proceeds to a step 97 where the lowest metrics is retrieved from the internal memory, together with the corresponding combination of parameters Fcro, R1, N1, R2, N2, . . . . Nn and Rn.

In a step 98, the process then configures the set of programmable dividers 403, 411, 413, 423, 424, . . . , 493 and 494 with the combination of parameters retrieved in step 97. The process then completes in a step 99.

The process which was described above was particularly suitable for processing metrics which may particularly correspond to spurs impact.

However, the process can also be adapted for the purpose of testing combinations of parameters Fcro, R1, N1, R2, N2, . . . . Nn and Rn in relation with one or more conditions, and such conditions are illustrated in FIGS. 9 and 10.

Figure 9:
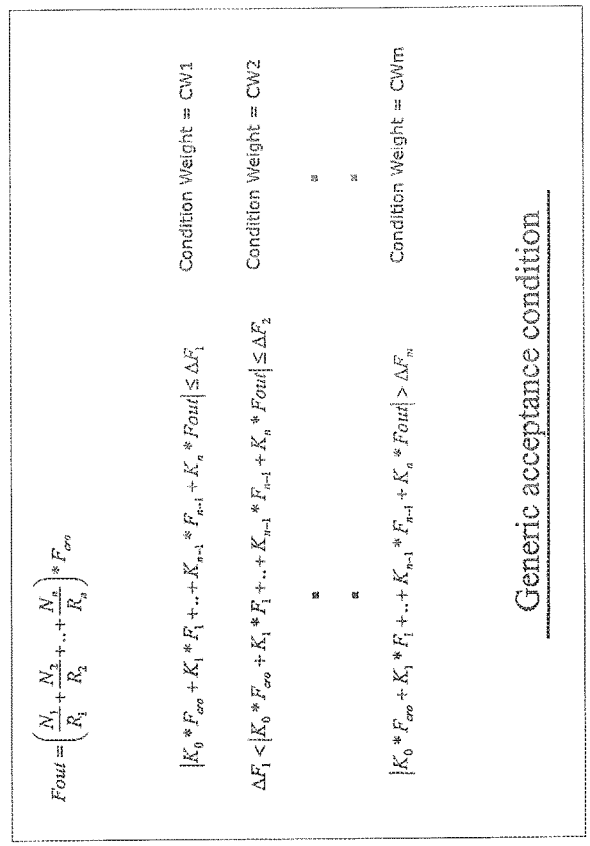

FIG. 9 more particularly illustrates the use of generic acceptance condition in relation with the equation of the multiloop PLL of figure:

$$F_{out} = (N1/R1 + N2/R2 + \ldots + Nn/Rn) * F_{cro}$$

Which shows that a first condition weight=CW1 applied on all intermediate frequencies Fcro, and F1, . . . Fn−1 may be used in relation with the condition:

$$|K_0 * F_{cro} + K_1 * F_1 + \ldots + K_{n-1} * F_{n-1} + K_n * Fout| \leq \Delta F_1$$

Where

Ki is an integer, with i=0 to n.

A condition weight=CW2 can also be applied with the following relation:

$$\Delta F_1 < |K_0 * F_{cro} + K_1 * F_1 + \ldots + K_{n-1} * F_{n-1} + K_n * Fout| \leq \Delta F_2$$

Etc. . . . and finally a condition weight CWm can be considered in relation with:

$$|K_0 * F_{cro} + K_1 * F_1 + \ldots + K_{n-1} * F_{n-1} + K_n * Fout| > \Delta F_m$$

FIG. 10 shows a typical illustrates of the use of different conditions, with associated weights:

A first condition, associated with a weight equal to 1, may be set for determining whether the K first harmonics of the Fcro frequency do not fall within a range of 1 Mhz centered around the desired output frequency:

$$|K * F_{cro} - Fout| \leq 1 \text{ MHz}$$

A second condition, associated with a weight equal to 0.8, can be used for ascertaining that the K first harmonics of the Fcro frequency do not fall within range of frequencies defined by the values below:

$$1 \text{ MHz} < |K * F_{cro} - Fout| \leq 2 \text{ MHz}$$

Similarly, a third condition, associated with a weight equal to 0.5, can be as follows:

$$2 \text{ MHz} < |K * F_{cro} - Fout| \leq 5 \text{ MHz}$$

And a fourth condition, associated with weight=0.2, can be used as follows:

$$5 \text{ MHz} < |K * F_{cro} - Fout| \leq 10 \text{ MHz}$$

Consequently, the embodiments which were described, in combination with the initialization process illustrated in FIGS. 6-8, shows quite a great flexibility for selecting an appropriate set of configuration parameters for programmable dividers composing the multiloop PLL.

The invention claimed is:

1. A multiloop phase locked loop (PLL) circuit comprising, in combination:
a first phase locked loop (PLL) loop comprising:
a first voltage controlled oscillator (200, 300, 400) for generating a first signal having a first frequency (Fcro);
a first phase detector (201, 301, 401) having first and second inputs, said first input receiving a reference frequency (Fref) and said second input receiving the output of a first programmable divider (203, 303, 403);
said first programmable divider (203, 303, 403) receiving said first signal;
a first loop filter (202, 302, 402) connected between said first phase detector and said first voltage controlled oscillator;
a second phase locked loop (PLL) comprising:
a second voltage controlled oscillator (210, 310, 410) generating a second signal having a second frequency (F1);
a second phase detector (211, 311, 411) having first and second inputs, said first input receiving a signal generated by a second programmable divider (214, 314, 414, R1) and said second input receiving the output of a third programmable divider (213, 313, 413, N1), wherein said second programmable divider (214, 314, 414, R1) and said third programmable divider (313, 313, 413, N1) are configured for respectively storing a first variable dividing ratio (R1) and a second variable dividing ratio (N1);
said second programmable divider (214, 314, 414, R1) having an input receiving said first signal;
said third programmable divider (213, 313, 413, N1) having an input receiving said second signal;
a second loop filter (212, 312, 412) having an input receiving the output of said second phase detector (211, 311, 411) and an output connected to an input of said second voltage controlled oscillator (210, 310, 410);
a third phase locked loop (PLL) comprising:
a third voltage controlled oscillator (220, 320, 420) for generating a third signal having a third frequency (F2);
a third phase detector (221, 321, 421) having first and second inputs, said first input receiving a signal generated by a fourth programmable divider (224, 324, 424, R2) and said second input receiving the output of a fifth programmable divider (223, 323, 423, N2); wherein said fourth programmable divider (224, 324, 424, R2) and said fifth programmable divider (223, 323, 423, N2) are configured for respectively storing a third variable dividing ratio (R2) and a fourth variable dividing ration (N2);

said fourth programmable divider (224, 324, 494 424, R2) having an input receiving said first signal;

said fifth programmable divider (223, 323, 423, N2) having an input receiving the output of a first low pass filter (225, 325, 425);

said first low pass filter (225, 325, 425) having an input connected to the output of a first mixer (219, 319);

said mixer ((219, 319, 419) having two inputs respectively receiving said second and said third signals;

a third loop filter (222, 322, 422) having an input receiving the output of said third phase detector (221, 321, 421) and an output connected to an input said third voltage controlled oscillator (220, 320, 420); whereby said third signal has a frequency (F2) generated in accordance with the relation:

$$F_2 = (N1/R1 + \ldots + N2/R2) * Fcro$$

wherein said first, second third and fourth programmable dividers are configured with variable dividing ratios selected to optimize one of the following:
a reduction of the range of one given ratio R1/N1 or R2/N2;
a reduction of the range of frequencies used by one among said first, said second and said third multi-loop phase locked loop (PLL) circuits; and
a reduction of spurs impact created by said first, said second and said third voltage controlled oscillators.

2. The multiloop phase locked loop (PLL) circuit according to claim 1, further comprising:
a fourth phase locked loop (PLL) comprising:
a fourth voltage controlled oscillator (330) for generating a fourth signal having a fourth frequency (Fout);
a fourth phase detector (331) having first and second inputs, said first input receiving a signal generated by a sixth programmable divider (334, R3) and said second input receiving an output of a seventh programmable divider (333, N3), wherein said sixth programmable divider (334, R3) and said seventh programmable divider (333, N3) are configured for respectively storing a fifth variable dividing ratio (R3) and a sixth variable dividing ratio (N3);
said sixth programmable divider (334, R3) having an input receiving said first signal;
said seventh programmable divider (333, N3) having an input receiving the output of a second low pass filter (335);
said second low pass filter (335) having an input connected to the output of a second mixer (329);
said second mixer (329) having two inputs respectively receiving said third signal (F2) and said fourth signal (Fout);
a fourth loop filter (332) having an input receiving the output of said fourth phase detector (334) and an output connected to an input of said fourth voltage controlled oscillator (330);
wherein said fourth signal has a frequency (Fout) which is generated in accordance with the relation:

$$F_{out} = (N1/R1 + N2/R2 + N3/R3) * F_{cro}$$

wherein said first, second third, fourth, fifth and sixth programmable dividers are configured with variable dividing ratios selected to optimize one of the following:
a reduction of the range of one given ratio R1/N1 or R2/N2 or R3/N3;
a reduction of the range of frequencies used by one among said first, said second, said third and said fourth multi-loop phase locked loop (PLL) circuit;
a reduction of spurs impact created by said first, said second, said third and said fourth voltage controlled oscillators.

3. The multiloop phase locked loop (PLL) circuit according to claim 2, further comprising additional $N^{th}$ phase locked loops (PLL) receiving in parallel said first signal (Fcro) at divide input (494) and previous PLL output (Fn-1) at mixer input (499) and generating an output signal $$F_{out} = (N1/R1 + N2/R2 + \ldots + Nn/Rn) * F_{cro}$$

where Ni/Ri is the dividing ratio of one phase locked loop for i=1 . . . n-1.

4. The multiloop phase locked loop (PLL) according to claim 1, wherein said first voltage controlled oscillator (200, 300, 400) is a coaxial resonator oscillator having a low phase noise.

5. The multiloop phase locked loop (PLL) according to claim 1, wherein said first programmable divider (203, 303, 403) is a fractional divider based on a sigma-delta conversion.

6. The multiloop phase locked loop (PLL) according to claim 1, wherein said second programmable divider (214, 314, 414, R1), said fourth programmable divider (224, 334, 494, R2) and said fifth programmable divider (223, 333, 443, N2) are integer dividers and said third programmable divider (213, 313, 413, N1) is a fractional divider.

7. A process for configuring the programmable dividers of the multiloop phase locked loop (PLL) circuit as defined in claim 1, comprising an initialization procedure including the steps of:
determining (62, 91) the values of Fout, Fcro_min and Fcro_max corresponding with a locking of said first voltage controlled oscillator (200, 300, 400) so as to produce the desired output frequency (Fout), said determination being performed by continuously varying the ratio of said first programmable dividers (203) together with a sensing of the voltage present at the output of said first loop filter and determining whether a voltage is higher than one first predetermined threshold;
initiating an iterative loop (92) for the purpose of testing all possible combinations of values (R1, N1, R2, N2, . . . Nn and Rn) used by said programmable dividers;
for each combination, computing (94) a metrics based on a function stored within a memory depending on the values of Fcro, as well as said dividers values (R1, N1, R2, N2, . . . Nn and Rn);
storing (95) into a memory the value of each metrics together with the current combination of dividers values (R1, N1, R2, N2, . . . Nn and Rn); and
testing (96) whether all combinations have been processed and, if so, retrieving the value of the lowest metrics; and
configuring said programmable dividers with the associated combination of parameters (R1, N1, R2, N2, . . . Nn and Rn) being stored into the memory and which correspond to the lowest metrics.

8. An RF frequency synthesizer comprising a multiloop phase locked loop (PLL) circuit as defined in claim 1.

9. A process for generating a stable and accurate output frequency (Fout), comprising the steps of:
providing a first phase locked loop (PLL) comprising:
a first voltage controlled oscillator (200, 300, 400) generating a first signal having a first frequency (Fcro), said first voltage controlled oscillator having low phase noise and which may be subject to a significant dispersion,
a first phase detector (201, 301, 401) having first and second inputs, said first input receiving a reference frequency (Fref) and said second input receiving the output of a fractional sigma-delta divider (203, 303, 403);
said fractional sigma-delta divider (203, 303, 403) receiving said first signal (Fcro); and
a first loop filter (202, 302, 402) having an input connected to the output of said phase detector (201, 301, 401) and having an output connected to the input of said first voltage controlled oscillator VCO (200, 300, 400);
providing a second phase locked loop (ELL) comprising:
a second voltage controlled oscillator (210, 310, 410) generating a second signal having a second frequency (F1);
a second phase detector (211, 311, 411) having first and second inputs, said first input receiving a signal generated by a first programmable divider (214, 314, 414, R1) and said second input receiving the output of a first fractional divider (213, 313, 413, N1), wherein said first programmable divider (214, 314, 414, R1) and said first fractional divider (213, 313, 413, N1) are configured for respectively storing a first variable dividing ration (R1) and a second variable dividing ration (N1);
said first programmable divider (214, 314, 414, R1) having an input receiving said first;
said first fractional divider (213, 313, 413, N1) having an input receiving said second signal; and
a second loop filter (212, 312, 412) having an input receiving the output of said second phase detector and an output connected to an input of said second voltage controlled oscillator (210, 310, 410);
providing a third phase locked loop (PLL) comprising:
a third voltage controlled oscillator (220, 330, 490) generating a third signal having a third frequency ($F_{out}$, F2);
a third phase detector (221, 321, 421) having first and second inputs, said first input receiving a signal generated by a second programmable divider (224, 324, 424, R2) and said second input receiving the output of a second fractional divider (223, 333, 443, N2), wherein said second programmable divider (224, 324, 424, R2) and said second fractional divider (223, 333, 443, N2) are configured for respectively storing a third variable dividing ratio (R2) and a fourth variable dividing ratio (N2);
said second programmable divider (224, 334, 494, R2) having an input receiving said first signal;
said second fractional divider (223, 333, 443, N2) having an input receiving the output of a first low pass filter (225, 325, 425);
said first low pass filter (225, 325, 425) having an input connected to the output of a first mixer (219, 319, 499);
said first mixer (219, 319) having two inputs respectfully receiving said second and said third signals; and a third loop filter (222, 322, 422) having an input receiving the output of said third phase detector (211, 331, 491) and an output connected to an input of said third voltage controlled oscillator (220, 330, 490);
wherein said third signal has a frequency (Fout) generated in accordance with the relation:

$$F_{out}=(N1/R1+N2/R2)*F_{cro}$$

wherein said first and second programmable dividers and said first and second fractional dividers are configured with variable dividing ratios selected to optimize
one of the following criteria:
a reduction of the range of one given ratio R1/N1 or R2/N2;
a reduction of the range of frequencies used by one among said first, said second and said third phase locked loop (PLL) circuits;
a reduction of spurs impact created by said first, said second and said third voltage controlled oscillators.

10. The process according to claim 9, further comprising the steps of:
providing a fourth phase locked loop (PLL) comprising:
a fourth voltage controlled oscillator (330) for generating a fourth signal having a fourth frequency (Fout);
a fourth phase detector (331) having first and second inputs, said first input receiving a signal generated by a sixth programmable divider (334, R3) and said second input receiving the output of a seventh programmable divider (333, N3), wherein said sixth programmable divider (334, R3) and said seventh programmable divider (333, N3) are configured for restively storing a fifth variable dividing ratio (R3) and a sixth variable dividing ratio (N3);
said sixth programmable divider (334, R3) having an input receiving said first signal;
said seventh programmable divider (333, N3) having an input receiving the output of a second low pass filter (335);
said second low pass filter (335) having an input connected to the output of a second mixer (329);
said second mixer (329) having two inputs respectively receiving said third signal (F2) and said fourth signal (Fout); and
a fourth loop filter (332) having an input receiving the output of said fourth phase detector (334) and an output connected to an input of said fourth voltage controlled oscillator (330);
wherein said fourth signal has a frequency (Fout) which is generated in accordance with the relation:

$$F_{out}=(N1/R1+N2/R2+N3/R3)*F_{cro}$$

wherein said first, second, third, fourth, fifth and sixth programmable dividers are configured with variable dividing ratios selected to optimize one of the following:
a reduction of the range of one given ratio R1/N1 or R2/N2 or R3/N3;
a reduction of the range of frequencies used by one among said first, said second, said third and said fourth multi-loop Phase Locked Loop (PLL) circuit;
a reduction of spurs impact created by said first, said second, said third and said fourth voltage controlled oscillators.

11. The process according to claim 9, wherein said first voltage controlled oscillator (200, 300, 400) is a coaxial resonator oscillator having a low phase noise.

12. The process according to claim 9, wherein said fractional sigma-delta divider (203, 303, 403) is a fractional divider based on a sigma-delta conversion.

13. The process according to claim 9, wherein said first programmable divider (214, 314, 414, R1), said second programmable divider (224, 334, 494, R2) and said second fractional divider (223, 333, 443, N2) are integer dividers and said first fractional divider (213, 313, 413, N1) is a fractional divider.

* * * * *